(12) United States Patent
Zhong et al.

(10) Patent No.: US 9,379,056 B2
(45) Date of Patent: Jun. 28, 2016

(54) SEMICONDUCTOR STRUCTURE AND METHOD FOR MANUFACTURING THE SAME

(71) Applicant: Institute of Microelectronics, Chinese Academy of Sciences, Beijing (CN)

(72) Inventors: Huicai Zhong, San Jose, CA (US); Qingqing Liang, Lagrangeville, NY (US)

(73) Assignee: INSTITUTE OF MICROELECTRONICS, CHINESE ACADEMY OF SCIENCES, Bejing (CN)

( * ) Notice: Subject to any disclaimer, the term of this patent is extended or adjusted under 35 U.S.C. 154(b) by 0 days.

(21) Appl. No.: 14/423,020

(22) PCT Filed: Sep. 17, 2012

(86) PCT No.: PCT/CN2012/081512
§ 371 (c)(1),
(2) Date: Feb. 20, 2015

(87) PCT Pub. No.: WO2014/029151
PCT Pub. Date: Feb. 27, 2014

(65) Prior Publication Data
US 2015/0243598 A1 Aug. 27, 2015

(30) Foreign Application Priority Data
Aug. 23, 2012 (CN) .......................... 2012 1 0303691

(51) Int. Cl.
*H01L 21/311* (2006.01)
*H01L 21/3213* (2006.01)
(Continued)

(52) U.S. Cl.
CPC ........ *H01L 23/528* (2013.01); *H01L 21/31111* (2013.01); *H01L 21/32133* (2013.01);
(Continued)

(58) Field of Classification Search
CPC .................. H01L 21/76838; H01L 21/76802; H01L 21/76831; H01L 21/3111; H01L 21/76877; H01L 23/5221; H01L 2924/00; H01L 21/823871; H01L 21/31111; H01L 21/31116; H01L 21/32133; H01L 21/0273
See application file for complete search history.

(56) References Cited

U.S. PATENT DOCUMENTS

| | | | |
|---|---|---|---|
| 2002/0060354 A1* | 5/2002 | Nakagawa | H01L 21/7682 257/618 |
| 2010/0167537 A1* | 7/2010 | Aton | G03F 1/144 438/674 |
| 2011/0177661 A1* | 7/2011 | Song | H01L 29/66825 438/264 |

FOREIGN PATENT DOCUMENTS

| | | |
|---|---|---|
| CN | 101114608 | 1/2008 |
| CN | 102034763 | 4/2011 |

OTHER PUBLICATIONS

International Search Report for PCT/CN2012/081512 mailed May 30, 2013.

*Primary Examiner* — Jasmine Clark
(74) *Attorney, Agent, or Firm* — Paul M. H. Pua; Foley & Lardner LLP

(57) ABSTRACT

The present invention provides a method for manufacturing a semiconductor structure, comprising: a) forming metal interconnect liners on a substrate; b) forming a mask layer to cover the metal interconnect liners and forming openings, which expose the metal interconnect liners, on the mask layer; c) etching and disconnecting the metal interconnect liners via the openings, thereby insulating and isolating the metal interconnect liners. The present invention further provides a semiconductor structure, which comprises a substrate and metal interconnect liners, wherein ends of the metal interconnect liners are disconnected by insulating walls formed within the substrate. The structure and the method provided by the present invention are favorable for shortening distance between ends of adjacent metal interconnect liners, saving device area and suppressing short circuits happening to metal interconnect liners.

10 Claims, 8 Drawing Sheets

(51) Int. Cl.
  *H01L 23/528* (2006.01)
  *H01L 21/768* (2006.01)
  *H01L 23/532* (2006.01)
(52) U.S. Cl.
  CPC .... *H01L21/76802* (2013.01); *H01L 21/76831* (2013.01); *H01L 21/76838* (2013.01); *H01L 21/76841* (2013.01); *H01L 21/76877* (2013.01); *H01L 23/53209* (2013.01); *H01L 23/53223* (2013.01); *H01L 23/53238* (2013.01); *H01L 23/53266* (2013.01); *H01L 2924/0002* (2013.01)

SEMICONDUCTOR STRUCTURE AND METHOD FOR MANUFACTURING THE SAME

CROSS REFERENCE TO RELATED APPLICATION

The present application is a national stage application, filed under 35 U.S.C. §371, of PCT Application No. PCT/CN2012/081512, filed on Sep. 17, 2012, entitled "SEMICONDUCTOR STRUCTURE AND METHOD FOR MANUFACTURING THE SAME", which claims priority benefit of Chinese patent application No. 201210303691.3, filed on 23 Aug. 2012, entitled "SEMICONDUCTOR STRUCTURE AND METHOD FOR MANUFACTURING THE SAME", each of which is herein incorporated by reference in its entirety.

FIELD OF THE INVENTION

The present invention relates to semiconductor manufacturing field, particularly, to a semiconductor structure and a method for manufacturing the same.

BACKGROUND OF THE INVENTION

With developments of the semiconductor structure manufacturing technology, integrated circuits with better performance and more powerful functions require greater element density, and sizes of elements and spacing among elements need to be further downscaled; accordingly, lithography process faces greater demand and challenges at formation of semiconductor structures. In traditional processes, steps for forming metal interconnect liners include: firstly, forming a lithographical pattern for wires on an insulating material via once-for-all lithography process; next, etching the insulating layer to expose interconnect wires on the base layer, such that deep trenches are engraved; finally, filling metal into the deep trenches through depositing or electroplating process, and then forming metal interconnect liners, which are individually isolated and insulated, by means of chemical mechanical polish (CMP). However, it is noteworthy that in each layer of the metal interconnect liners, there are many collinear interconnect wires that have the same critical size and spacing. Along with further downscaling of feature sizes, chip area also shrinks significantly; consequently, the traditional process for manufacturing interconnect wires needs to be further modified so as to satisfy requirements in development of technologies, for example, reducing distance between ends of collinear interconnect wires at the meantime of suppressing short-circuit problems that may happen to interconnect wires due to small spacing among metal interconnect liners.

SUMMARY OF THE INVENTION

The present invention is intended to provide a method for manufacturing metal interconnect liners, which are favorable for shortening distance between ends of adjacent metal interconnect liners, and suppressing short-circuit problems that probably arise from small spacing among metal interconnect liners. Specifically, the method comprises following steps:
(a) forming metal interconnect liners on a substrate;
(b) forming a mask layer to cover the metal interconnect liners, and forming openings on the mask layer to expose the metal interconnect liners; and
(c) etching and disconnecting the metal interconnect liners via the openings, so as to make the metal interconnect liners insulated and isolated.

The present application further provides a semiconductor structure, which comprises a substrate and metal interconnect liners formed on the substrate, wherein ends of the metal interconnect liners are separated by insulating walls formed within the substrate.

Wherein, materials for the metal interconnect liners may be Cu, Al, W, Ni.

The etching method in step c) may be RIE dry etching, laser ablation, electron beam etching or focused ion beam etching.

Optionally, deep trenches are filled after implementation of the step c) of etching the metal interconnect liners; the material for filling the deep trenches may be $SiO_2$, SiOF, SiCOH, SiO, SiCO, SiCON, etc.

According to the metal interconnect liners and the method for manufacturing the same provided by the present invention, the metal interconnect liners are insulated and isolated through only one step of an independent mask etching process, which is quite favorable for reducing distance between ends of adjacent metal interconnect liners, saving device area and suppressing short-circuit problems that probably arise from small spacing among metal interconnect liners.

BRIEF DESCRIPTION OF THE DRAWINGS

Other additional features, aspects and advantages of the present invention are made more evident according to perusal of the following detailed description of exemplary embodiment(s) in conjunction with accompanying drawings.

The same or similar reference signs in the drawings denote the same or similar elements.

DETAILED DESCRIPTION OF THE INVENTION

Figure 1:
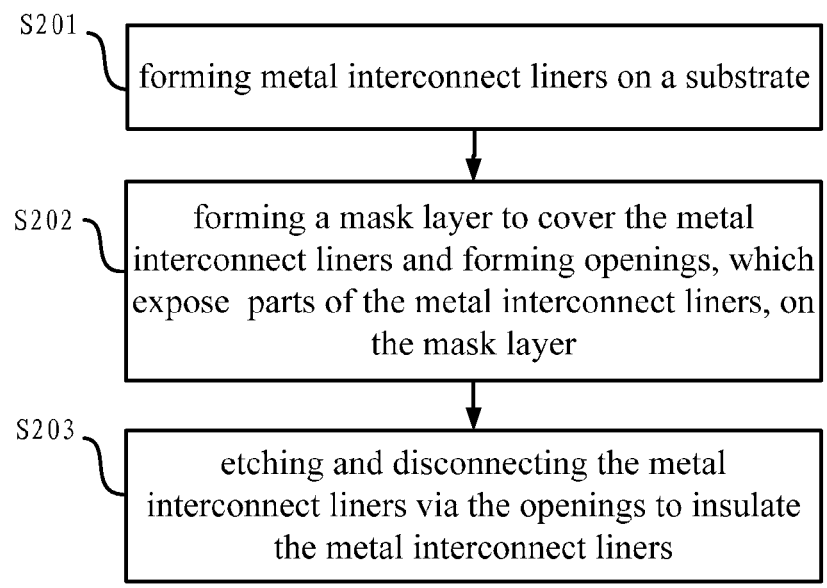
FIG. 1 illustrates a diagram of a method for manufacturing a semiconductor structure provided by the present invention.

Embodiments of the present invention are to be described at length below, wherein examples of embodiments are illustrated in the drawings, in which same or similar reference signs throughout denote same or similar elements or elements have same or similar functions. It should be appreciated that embodiments described below in conjunction with the drawings are illustrative, and are provided for explaining the present invention only, thus shall not be interpreted as a limit to the present invention. Various embodiments or examples are provided here below to implement different structures of the present invention. To simplify the disclosure of the present invention, descriptions of components and arrangements of specific examples are given below. Of course, they are only illustrative and not limiting the present invention. Moreover, in the present invention, reference numbers and/or letters may be repeated in different examples. Such repetition is for purposes of simplicity and clarity, yet does not denote any relationship between respective embodiments and/or arrangements under discussion. Furthermore, the present invention provides various examples for various processes and materials. However, it is obvious for a person of ordinary skill in the art that other processes and/or materials may be alternatively utilized. In addition, following structures where a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

FIG. 1 illustrates a diagram of a method for manufacturing a semiconductor structure provided by the present invention; FIG. 2(a) to FIG. 7(b) illustrate respectively cross-sectional views of a semiconductor structure manufactured according to an embodiment of the method for manufacturing a semiconductor structure as illustrated in FIG. 1. Here below, the method for manufacturing a semiconductor structure as illustrated in FIG. 1 is described in depth in conjunction with FIG. 2(a) to FIG. 8. However, it is noteworthy that the figures for embodiments of the present invention are provided for purposes of illustration, thus are not necessarily drawn to scale.

With reference to FIG. 2(a) to FIG. 5(b), metal interconnect liners are formed on a substrate at step S101. Wherein, the step S101 comprises following three steps: i) forming a layer of photoresist on an insulating layer and patterning the same; ii) etching the insulating layer to form trenches; iii) and forming metal interconnect liners within the trenches.

Wherein, the insulating layer is positioned on the substrate and may be in a single layer or multi-layer structure; the material for the insulating layer may be selected from a group consisting of $SiO_2$, $Si_3N_4$, $Si_2N_2O$, BSG, PSG, BPSG and combinations thereof. The material for the substrate, which is not shown in the drawings, includes Si substrate (e.g. wafer). According to design requirements in the prior art (e.g. a P-type substrate or an N-type substrate), the substrate may be of various doping configurations. The substrate in other embodiments may further include other basic semiconductors, for example germanium. Alternatively, the substrate may include a compound semiconductor, such as SiC, GaAs, InAs or InP. Typically, the substrate may have but not limited to a thickness of around several hundred micrometers, which for example may be in the range of 100 μm-800 μm. The substrate may further comprise circuit element structures such as field effect transistors, diodes, triodes and interconnect wires.

Figure 2A:
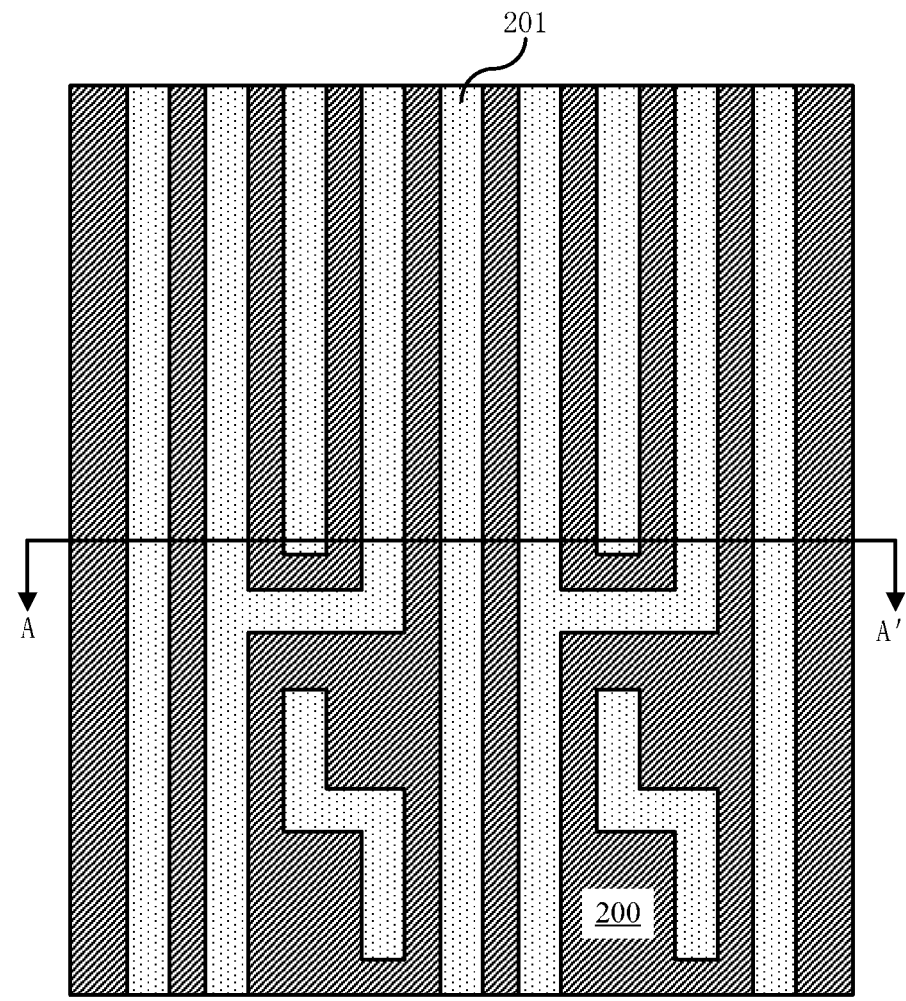
FIG. 2(a) to FIG. 8 illustrate respectively cross-sectional views of a semiconductor structure manufactured at respective stages according to a preferred embodiment of the method for manufacturing a semiconductor structure as illustrated in FIG. 1.
Figure 2B:
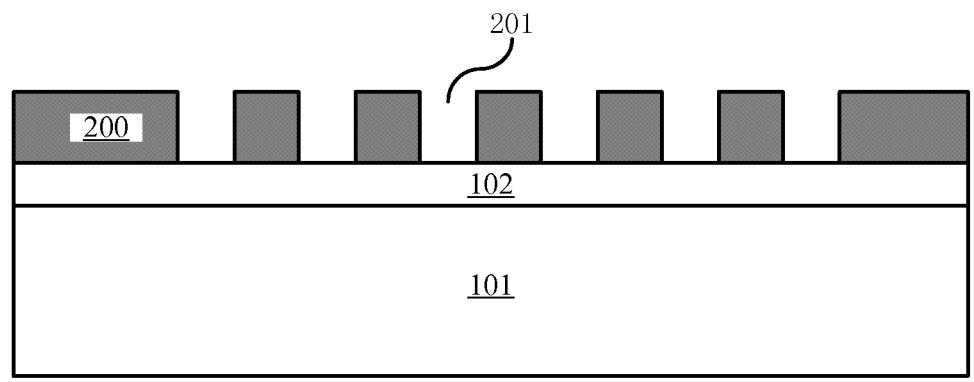

Specifically, at first, a layer of photoresist 200 is formed on an insulating layer and then is patterned. FIG. 2(a) and FIG. 2(b) illustrate bird's-eye view and cross-sectional view of the patterned photoresist layer formed on the insulating layer, respectively. Wherein, the insulating layer is in double-layer structure, which comprises an insulating layer 101 and an insulating layer 102. Openings 201 are formed on the photoresist layer 200 by means of exposing and developing processes, thereby outlining patterns for the metal interconnect liners.

Particularly, under circumstances when the distance between ends of collinear adjacent metal interconnect liners is fairly small, the collinear adjacent metal interconnect liners are not isolated at step S101.

Figure 3A:
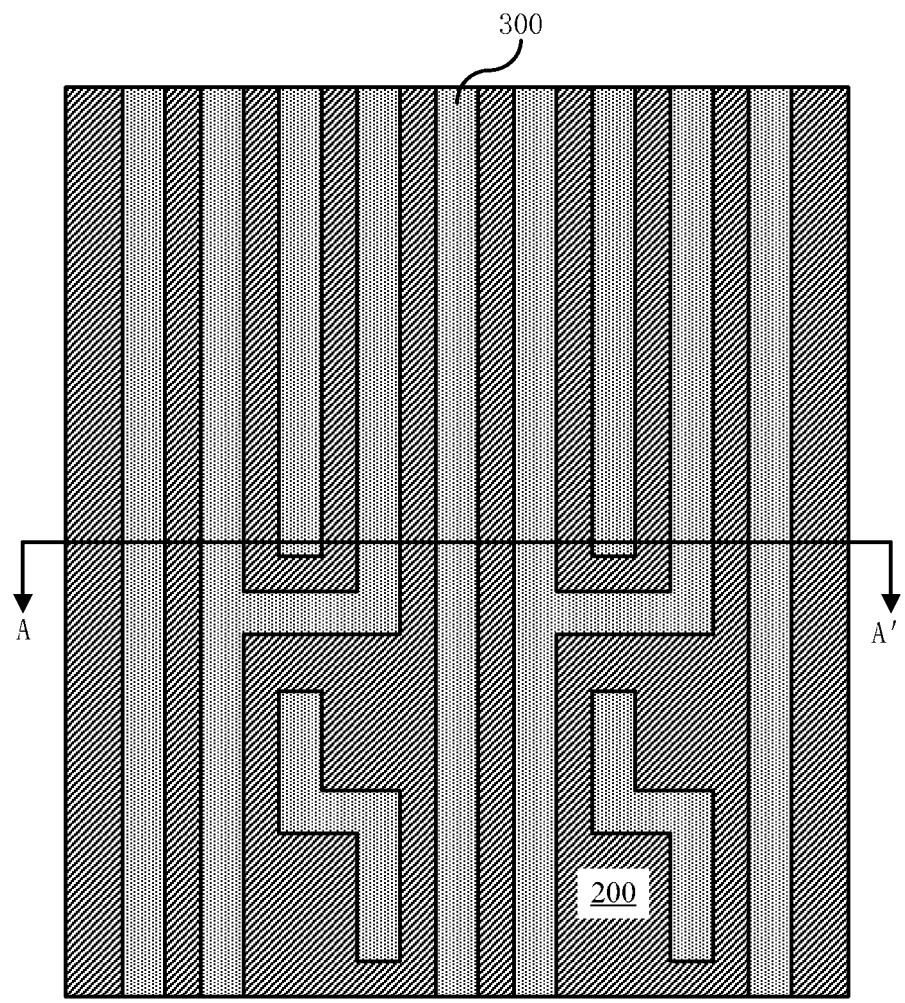
Figure 3B:
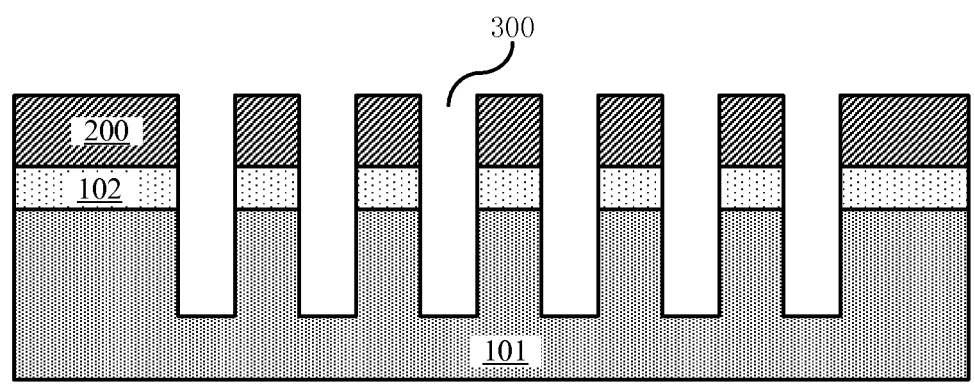
Figure 4A:
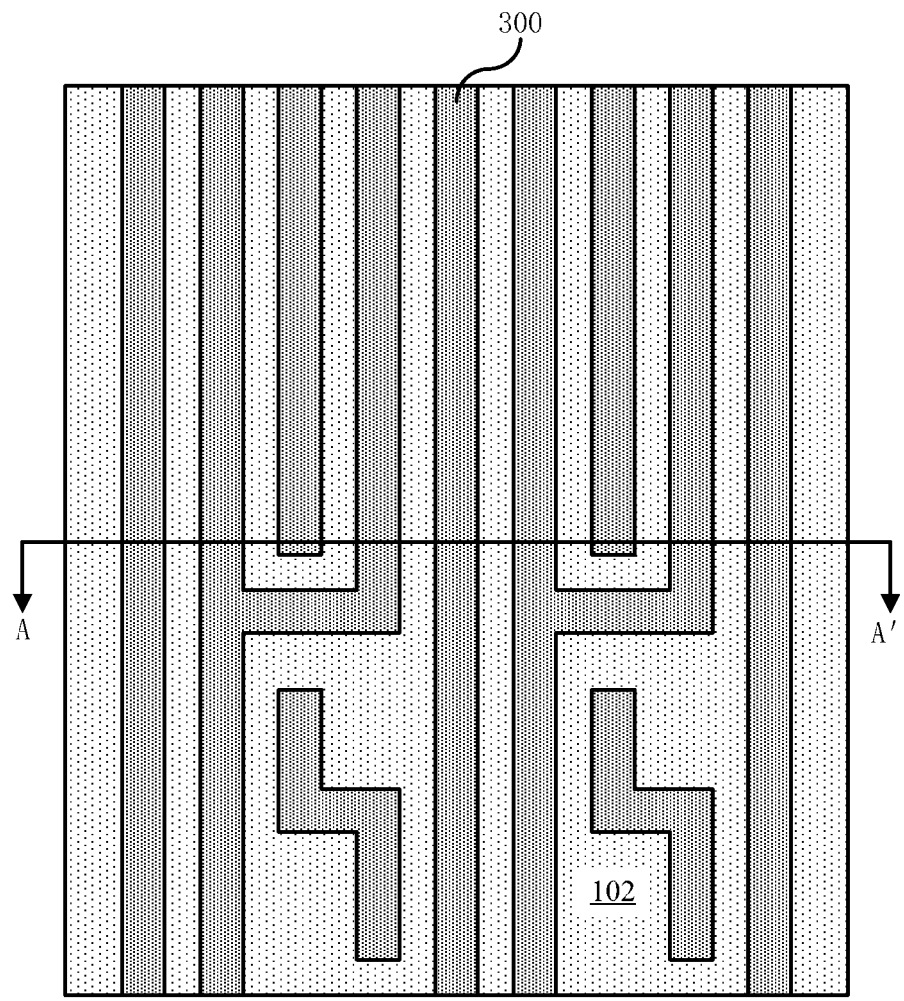
Figure 4B:
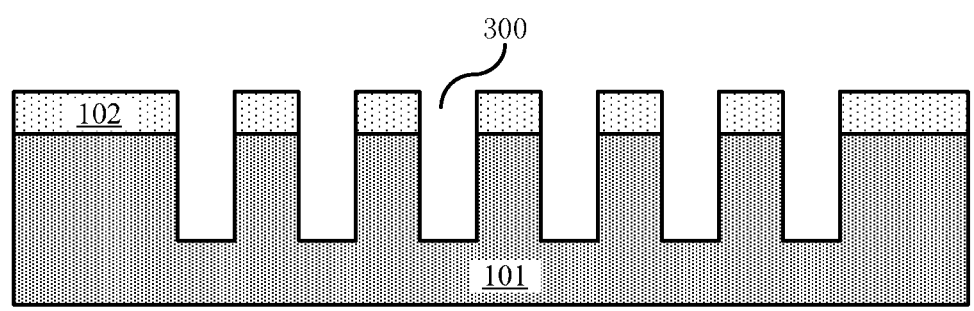

Then, the insulating layer is etched via openings 201 to form trenches 300, which go through the insulating layer 102 and go further deeply into the insulating layer 101, as shown in FIGS. 3(a) and 3(b). Then, the photoresist 200 is removed, as shown in FIG. 4(a) and FIG. 4(b). The method for etching the insulating layer may be dry RIE etching or other etching processes as appropriate.

Figure 5A:
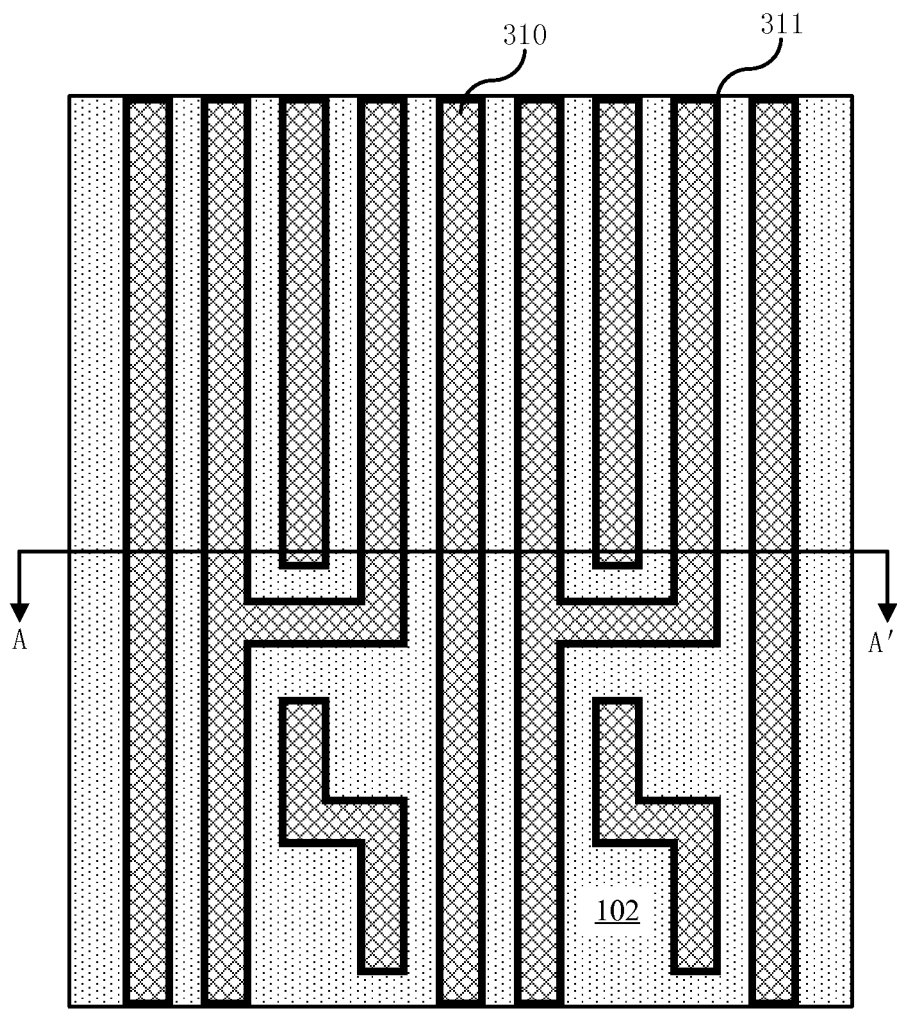
Figure 5B:
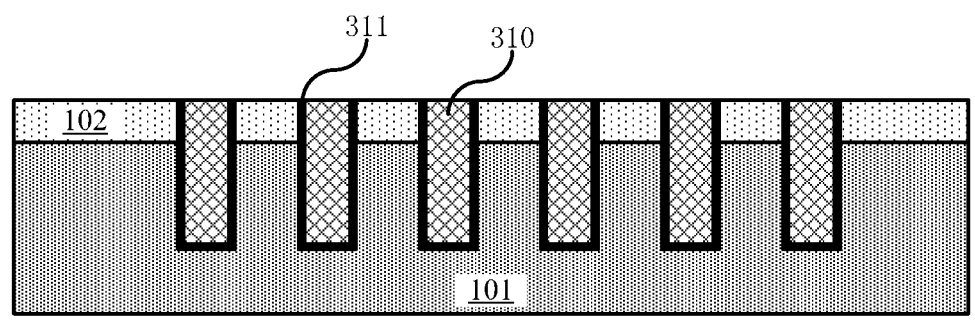

Then, metal is filled into the trenches 300, which then is treated through chemical mechanical polish (CMP) to form metal interconnect liners 310, as shown in FIG. 5(a) and FIG. 5(b). The material for the metal interconnect liners is Cu, Al, W, Ni or the like and may be filled into the trenches by means of chemical vapor deposition, electrical plating, sputtering or other processes as appropriate. Optionally, prior to filling metal, a blocking layer 311 may be further formed on sidewalls of the trenches, as shown in FIG. 5(a) and FIG. 5(b), for purposes of blocking electrical migration of the metal and suppressing default of devices. The material for the blocking layer 311 may be Ti, TiN, Ta, TaN or the like.

Figure 6A:
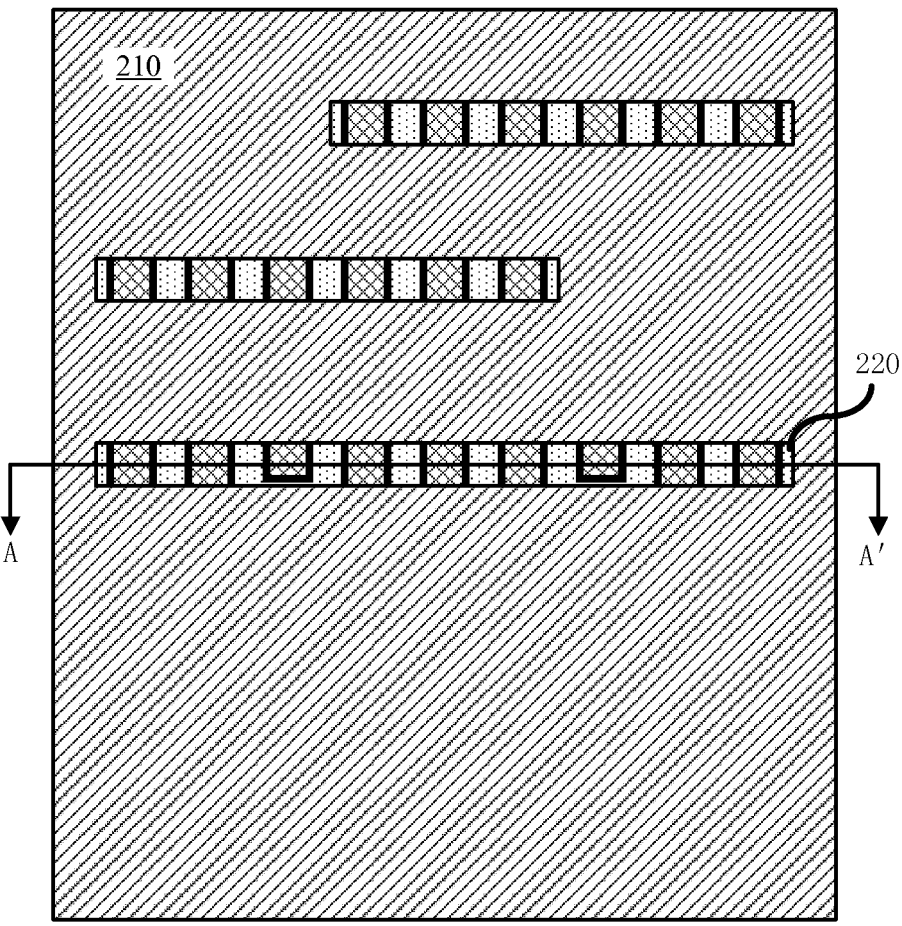
Figure 6B:
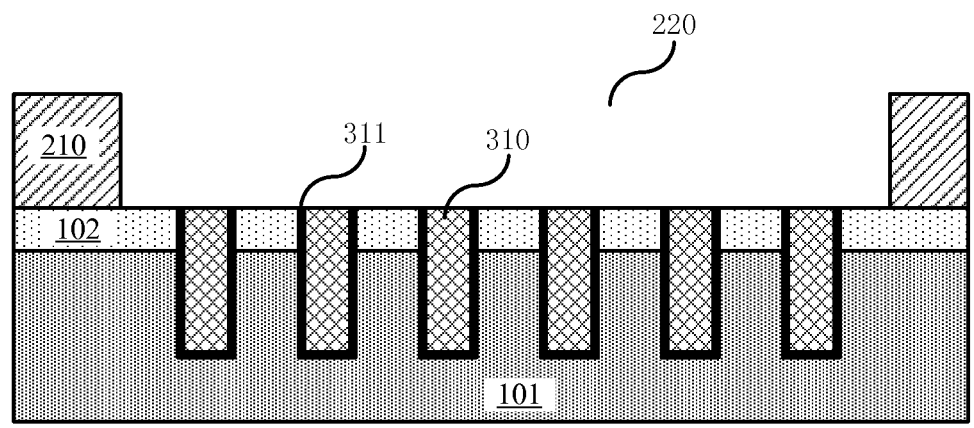

At step S102, a mask layer 210 is formed to cover the metal interconnect liners, and openings 220 are formed on the mask layer 210 to expose the metal interconnect liners, with reference to FIG. 6(a) and FIG. 6(b). Wherein, the material for the mask layer 210 is photoresist, $Si_3N_4$ or the like. The etching selectivity of the mask layer 210 is different from that of the insulating layers 101 and 102. Openings 220 are formed by means of exposing and developing process or dry RIE etching.

Figure 7A:
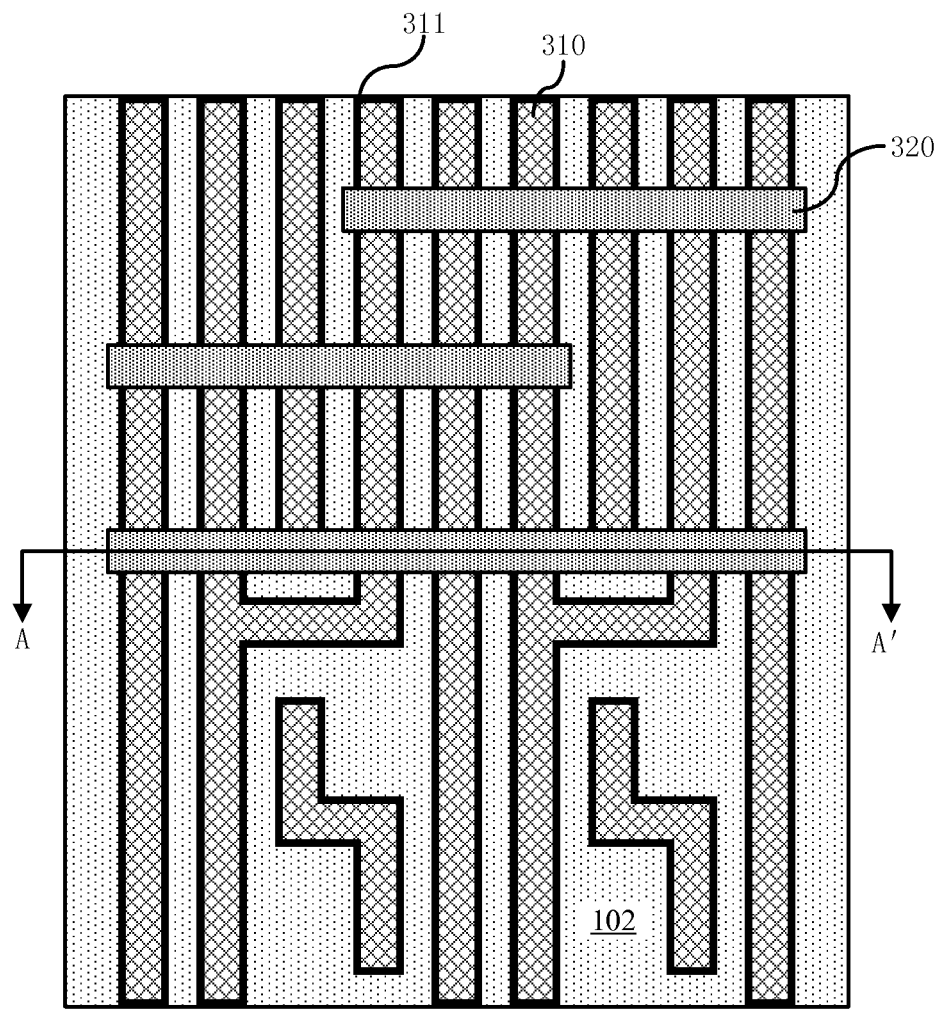
Figure 7B:
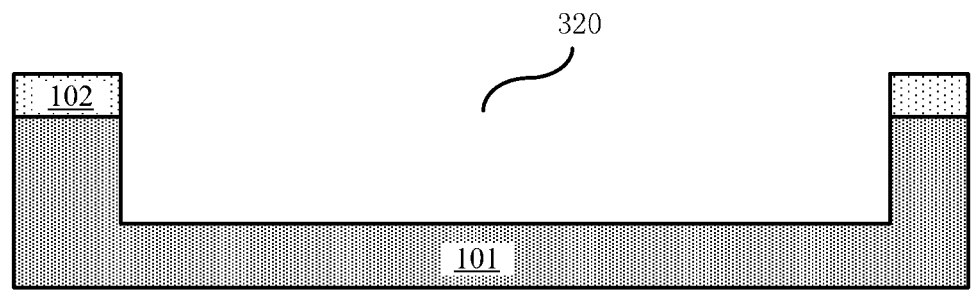

Then, as shown in FIG. 7(a) and FIG. 7(b), step S103 is implemented to form deep trenches 320 through etching the metal interconnect liners 310 and the blocking layer 311 via the openings 220, such that the metal interconnect liners are insulated and isolated. The etching processes include RIE dry etching, laser ablation, electron beam etching or focused ion beam etching The photoresist is removed to form the deep trenches 320 that go through the metal interconnect liners 310 and the blocking layer 311 till reach the insulating material laid at the bottom. Because the metal interconnect liners 310 may be etched at a speed different from the speed of etching the insulating layers 101 and 102, therefore, it is preferred to etch the metal interconnect liners 310 at a faster etching speed, thereby guaranteeing to isolate exactly the metal interconnect liners 310 through etching. By means of etching, two bars of attached metal interconnect liners are isolated and insulated, and the distance between two ends of the collinear metal interconnect liners is brought under control by means of lithographical scaling, thereby shortening the distance, saving area and suppressing short circuits happening to metal interconnect liners.

Figure 8:
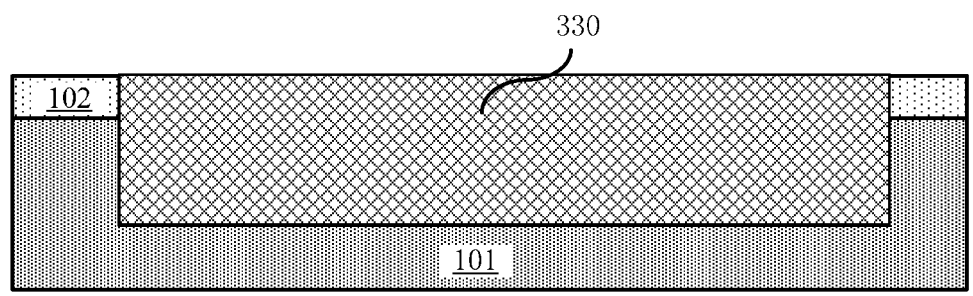

Optionally, after formation of the deep trenches 320, the deep trenches 320 are filled to form insulated walls 330 (as shown in FIG. 8); the filling may be a low k material, for example, $SiO_2$, SiOF, SiCOH, SiO, SiCO, SiCON, so as to reduce capacitance among the interconnect wires. The filling for the insulated wall 330 may be different from the material of the insulating layers 101 and 102. Preferably, the thickness of the insulated walls 330 is smaller than the width of the metal interconnect liners. By means of the method and the structure provided by the present invention, the distance between ends of metal interconnect liners can be effectively shortened.

Manufacture of the semiconductor device is completed according to conventional steps in the traditional process, for example, forming a new layer of metal interconnect liners through repeating aforementioned process for forming metal interconnect liners, and manufacturing land pad.

Although the exemplary embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, which comprises following steps:
    (a) forming metal interconnect liners on a substrate;
    (b) forming a mask layer to cover the metal interconnect liners and then forming openings on the mask layer, wherein the openings expose parts of the metal interconnect liners;
    (c) etching the parts of the metal interconnect liners exposed via the openings to disconnect and insulate the metal interconnect liners.

2. The method of claim 1, wherein the material for the metal interconnect liners is selected from a group consisting of Cu, W, Al and Ni.

3. The method of claim 1, wherein at step a), one or more layers of insulating layer are laid on the substrate.

4. The method of claim 3, wherein the material for the insulating layer is selected from a group consisting of $SiO_2$, $Si_3N_4$, $Si_2N_2O$, BSG, PSG, BPSG and combinations thereof.

5. The method of claim 1, wherein at step c), the parts of the metal interconnect liners exposed via the openings are etched by RIE dry etching, laser ablation, electron beam etching or focused ion beam etching.

6. The method of claim 1, wherein, the step a) comprises:
    i) forming a layer of photoresist on an insulating layer of the substrate and patterning the layer of photoresist;
    ii) etching the insulating layer to form trenches; and
    iii) forming the metal interconnect liners within the trenches.

7. The method of claim 6, wherein, prior to formation of the metal interconnect liners, the step iii) further comprises forming a blocking layer on sidewalls of the trenches.

8. The method of claim 7, wherein the material for the blocking layer is Ti, TiN, Ta, TaN or the like.

9. The method of claim 1, wherein the step c) further comprises: filling the openings after etching the metal interconnect liners.

10. The method of claim 9, wherein the material for filling the openings is selected from a group consisting of $SiO_2$, SiOF, SiCOH, SiO, SiCO and SiCON.

* * * * *